(12) United States Patent
Rubenstein

(10) Patent No.: US 7,408,788 B2
(45) Date of Patent: Aug. 5, 2008

(54) DEVICE AND METHOD FOR CIRCUIT BOARD INSERTION AND REMOVAL

(75) Inventor: Brandon A. Rubenstein, Loveland, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 836 days.

(21) Appl. No.: 10/379,652

(22) Filed: Mar. 5, 2003

(65) Prior Publication Data

US 2004/0174686 A1    Sep. 9, 2004

(51) Int. Cl.
    *H05K 7/14*     (2006.01)
(52) U.S. Cl. .................. 361/801; 361/754; 361/759
(58) Field of Classification Search ............... 361/759, 361/769, 684, 685, 754, 798, 802, 801; 70/208; 439/327, 160, 157, 325; 211/26, 89.01, 41.17
See application file for complete search history.

(56) References Cited

U.S. PATENT DOCUMENTS

| 4,521,063 | A | * | 6/1985 | Milc | 439/55 |
|---|---|---|---|---|---|
| 4,632,588 | A | * | 12/1986 | Fitzpatrick | 403/16 |
| 4,914,550 | A | * | 4/1990 | Filsinger et al. | 361/715 |
| 5,162,979 | A | * | 11/1992 | Anzelone et al. | 361/686 |
| 5,414,594 | A | * | 5/1995 | Hristake | 361/755 |
| 5,793,614 | A | * | 8/1998 | Tollbom | 361/732 |
| 6,160,717 | A | * | 12/2000 | Desousa et al. | 361/798 |
| 6,269,007 | B1 | * | 7/2001 | Pongracz et al. | 361/759 |
| 6,515,866 | B2 | * | 2/2003 | Ulrich | 361/759 |
| 6,537,085 | B2 | * | 3/2003 | Na | 439/76.1 |

* cited by examiner

*Primary Examiner*—Paula A. Bradley
*Assistant Examiner*—Thanh S Phan

(57) ABSTRACT

Disclosed is a device for insertion and removal of a circuit board into a mating connector positioned within a housing, the device having a first end for pivotal engagement with the circuit board and adapted to mate with a front surface of the housing when the circuit board to which the device is pivotally engaged begins to engage the connector, and a second end disposed longitudinally from the first end and adapted with a latch for releasably mating with a protrusion on the board such that when the board is engaged with the connector the second end becomes releasably mated to the protrusion thereby latching the board to the connector.

17 Claims, 9 Drawing Sheets

DEVICE AND METHOD FOR CIRCUIT BOARD INSERTION AND REMOVAL

FIELD OF THE INVENTION

This invention relates to circuit board latches and more particularly to a device and method for circuit board insertion and removal.

DESCRIPTION OF RELATED ART

It is now common practice to insert printed wiring boards (PWBs) and other electronic devices into housings where contacts on the PWB are inserted into a connector attached to the housing. Typically, such housings have a plurality of slots into which PWBs may be positioned, either vertically or horizontally. Often a considerable amount of force is necessary to push the PWB contacts into the mating connector on the housing to insure proper electrical contact is made and maintained throughout the time the PWB remains in the housing. Accordingly, it is often useful to fasten the PWBs into the housing in a semi-permanent manner, so that, regardless of the vibration or other operational characteristics of the housing, the PWBs remain firmly in place.

Often such latching of the boards is accomplished by a screw or other locking device which requires some degree of skill on the part of the user. Moreover, the semi-permanent latching often requires a tool and/or an appreciable amount of time to accomplish both the locking and unlocking operations.

Alternatively, some latching mechanisms rely on friction or gravity to maintain the PWBs into the back plane connector. However, particularly in some environments, such a technique provides less than ideal retention of the PWB. In addition, many presently available solutions require a large amount of board space in order to function properly and the user generally needs to be familiar with their operation in order to properly latch or unlatch a PWB.

BRIEF SUMMARY OF THE INVENTION

An embodiment of the present invention provides a device for insertion and removal of a circuit board into a mating connector positioned within a housing, the device comprising a first end for pivotal engagement with the circuit board and adapted to mate with a front surface of the housing when the circuit board to which the device is pivotally engaged begins to engage the connector, and a second end disposed longitudinally from the first end and adapted with a latch for releasably mating with a protrusion on the circuit board such that when the board is engaged with the connector the second end becomes releasably mated to the protrusion thereby latching the board to the connector.

Another embodiment of the present invention provides a method of locking a printed wiring board into a connector, the connector mounted to a housing, the housing having at least one guide for positioning the board with respect to the connector, the method comprising placing a board within the guide in a direction such that the board will, upon the application of insertion force thereupon, move into mated relationship with the connector, applying the insertion force to the board to move the board toward the connector until a first end of a device which is pivotally mounted to the board engages with an edge of the housing, rotating the device so that a longitudinal portion of the device engages on a portion of the board, continuing to apply force to the device so as to move the board and the connector into the mated relationship, and retaining the device in an engaged position on the portion of the board, even after the external insertion force has been removed, the engaged position preventing the board from becoming disconnected from the connector at least in part by the first and of the device engaging the edge of the housing.

An embodiment of the present invention provides a device for locking a printed wiring board (PWB) into a connector, the connector mounted to a housing, the housing having at least one guide for positioning the board with respect to the connector, the device comprising means for applying an external insertion force to the PWB to move the PWB toward the connector along the guide, the means having a first end pivotally attached to the PWB board, the first end having a portion for engaging with a portion of the housing, means for contacting a front edge of the PWB along a longitudinal portion of the device, and means for maintaining at least a portion of the insertion force after the external insertion force has been removed.

An embodiment of the present invention provides a latching device for use with housing accepting a plurality of electronic boards into mating relationship with a plurality of connectors affixed to the housing, the housing having at least one locking portion for mating with the latching device pivotally mounted on at least one electronic board, the latching device comprising means for applying an external insertion force to an electronic board of the plurality of electronic boards to move the electronic board toward a corresponding connector of the plurality of connectors along a guide, the means having a first end pivotally attached to the board, the first end having a portion for engaging with a portion of the housing, means for contacting a front edge of the PWB along a longitudinal portion of the device, and means for maintaining at least a portion of the insertion force after the external insertion force has been removed.

Another embodiment of the present invention provides a latching device for use with an electronic circuit board mating with a connector within a housing, the housing having at least one locking portion for mating with the latching device pivotally mounted to the board, the latching device comprising means for applying an external insertion force to the electronic circuit board to move the electronic circuit board toward the connector along a guide, the means having a first end pivotally attached to the electronic circuit board, the first end having a portion for engaging with a portion of the housing, means for contacting a front edge of the electronic circuit board along a longitudinal portion of the device, means for maintaining at least a portion of the insertion force after the external insertion force has been removed, and wherein the board contains a protrusion for operation in conjunction with the maintaining means.

An embodiment of the present invention provides a printed wiring board (PWB) adapted for latching into a mated relationship with a housing mounted connector, the PWB comprising a protrusion for releasable accepting a latching mechanism, the latching mechanism operable, in conjunction with the protrusion, and with an outer portion of the housing, for maintaining positive force between the PWB and the connector after externally applied insertion force has been removed.

An embodiment of the present invention provides a device for aiding in latching an electronic circuit board in a mated relationship with an electrical connector, the connector located at a back end of a housing, the device comprising a first end for engaging a front surface of the housing, means for pivoting the first end around an outer corner of a circuit board to be latched, a second end disposed laterally from the first end the second end comprising a latch mechanism for releasably latching to a pin mounted on the board, and a body extending between the ends, the body having upper and lower portions separated by a distance to allow at least a portion of the board to fit between the portions when the latch mechanism is latched to the pin.

DETAILED DESCRIPTION

Figure 1:
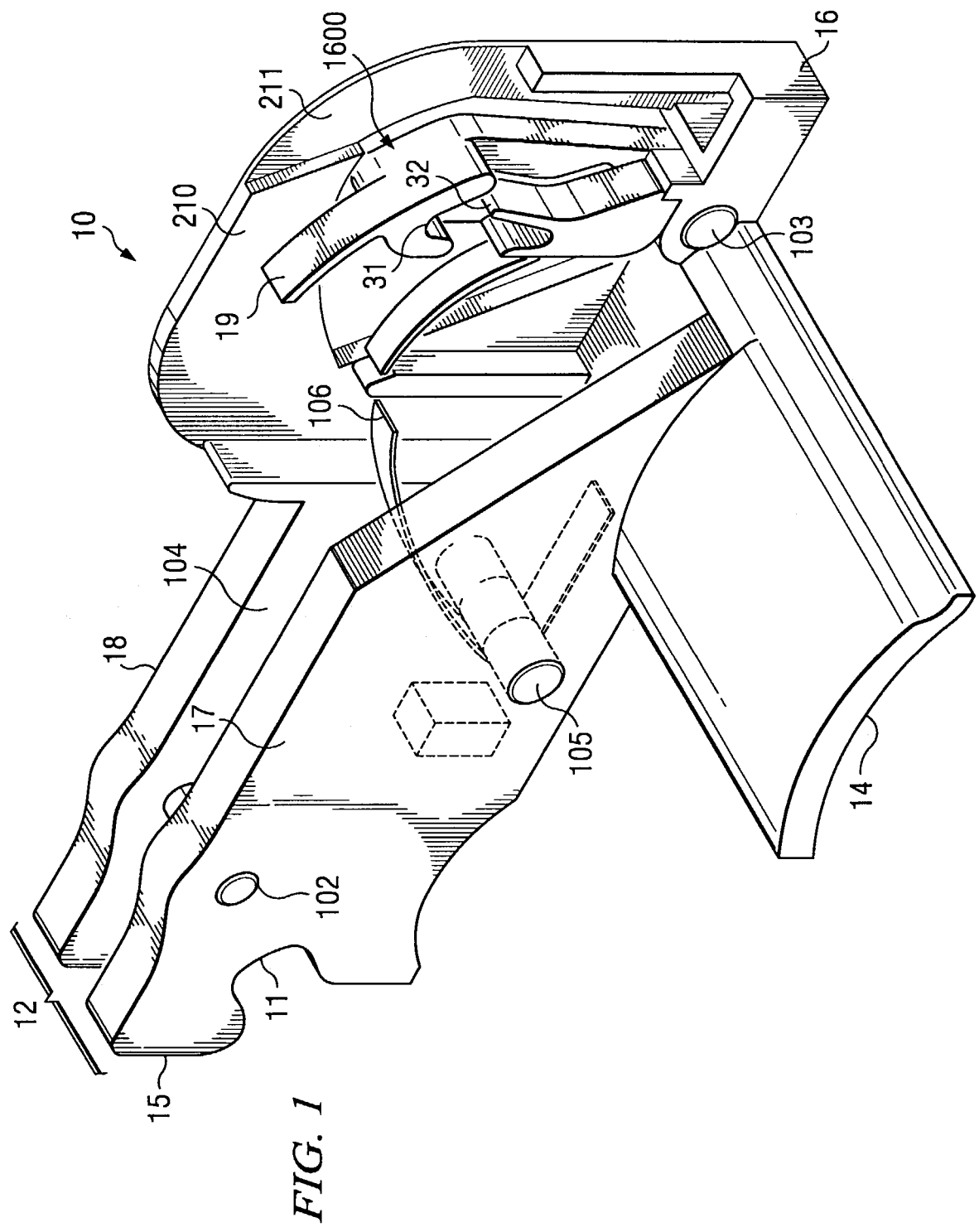
FIG. 1 shows an isometric view of one embodiment of a circuit board insertion/retraction device.

FIG. 1 shows one embodiment of insertion retraction device 10 with leading end 15 for engaging with an edge of a connector housing (e.g., edge 24 of connector guide 23 shown in FIG. 2) and trailing end 16 for releasably latching to the circuit board, as will be detailed more fully hereinafter. Edge 15 has notch 11 which engages the housing and has hole 102 for pivoting around a pin passed through a host circuit board.

Advantageously, device 10 has an upper portion 17 and a lower portion 18, separated by gap 104 which comprise the main longitudinal body 12. Within gap 104 of the illustrated embodiment is spring 106 which pivots around pin 105, as will be discussed hereinafter, to apply outward pressure on device 10 when the device is engaged with a circuit board. Pin 105 may also serve to maintain gap 104. Thumb tab 14 allows a user to apply force on device 10 to push a PWB into a connector and to pull the PWB out of the connector, as will be discussed. Latching mechanism 1600 (shown in more detail in FIGS. 16A and 16B) is surrounded by a housing having top cover 210 and side cover 211. The operation of latching mechanism 1600 will be discussed hereinafter.

Figure 2:
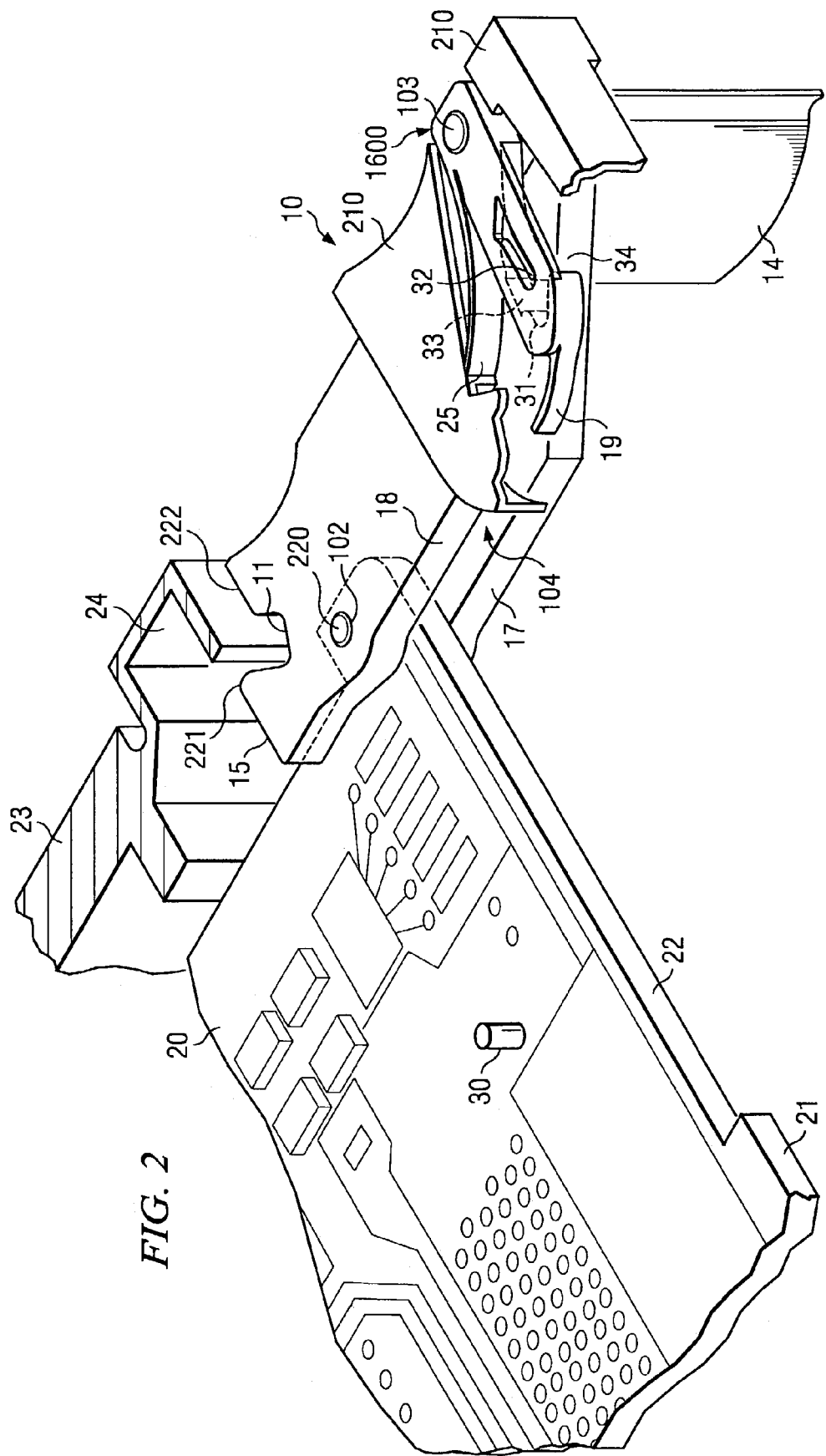
FIG. 2 shows the circuit insertion/retraction device of FIG. 1 pivotally attached to a corner of a circuit board just prior to engaging the circuit board housing.

FIG. 2 shows device 10 connected to PWB 20 by pivotal pin 220 positioned through hole 102. Guide 23, such as may comprise a portion of a larger housing (such as housing 1700 of FIG. 17), and PWB 20 are shown cut-away. The portion of PWB 20 that is not shown in FIG. 2 preferably contains a connector portion which mates with connectors in the back portion of a corresponding housing, such as housing 1700 of FIG. 17. Also not shown are board guides which extend from the back portion of guide 23 along the sides of the housing. Guide 23 preferably positions PWB 20 into the connector according to embodiments of the invention. While PWB 20 is shown in a horizontal position, PWB 20 could also be mounted vertically or in any other orientation and the same principles discussed herein would apply. Also note, that while device 10 is shown on the right side of PWB 20, device 10 could be positioned on either side, or preferably on both sides.

Outer edge of guide 23 of the illustrated embodiment contains edge 24, which in this embodiment has a U-shape configuration, but could be any of several configurations. Notch 11 of device 10 has a shape that allows it to engage with the shape of edge 24. The relative shapes of elements 11 and 24 as well as end 15 (including areas 221 and 222), can be adjusted as desired.

As shown in FIG. 2, PWB 20 has outer edge 21 which has been recessed in this embodiment at area 22 to accept at least a portion of device 10. This recess is advantageous if it is desired to have the front surfaces of inserted PWBs, having device 10 thereon engaged, relatively flat. Opening 104 (between lower portion 17 and upper portion 18) is adapted to clear any parts which might be mounted at the outer edge of PWB 20. Mounted on PWB 20 of preferred embodiments is a protrusion, such as pin 30. The purpose being such that when the board is forced into the mating connector and device 10 has been rotated toward PWB 20 (to the left in FIG. 2), and force has been removed from the outer edge of device 10, the board will remain latched in position by a wedge formed between pin 30 and the engagement of notch 11 with guide edge 24. This wedge can be thought of as an over-center snap lock.

Figure 3:
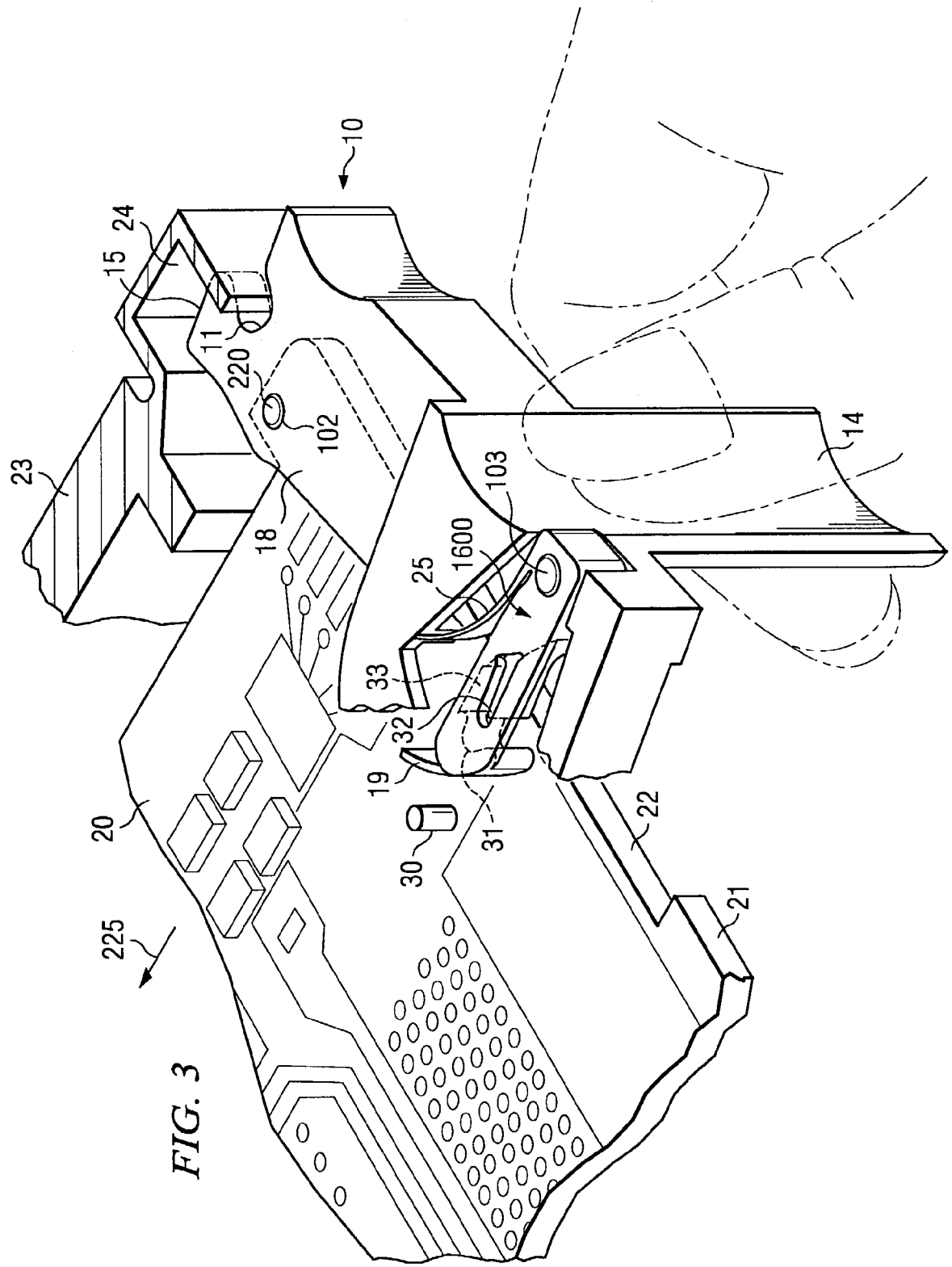
FIG. 3 shows the insertion/retraction device of FIG. 1 after engagement a board housing.
Figure 17:
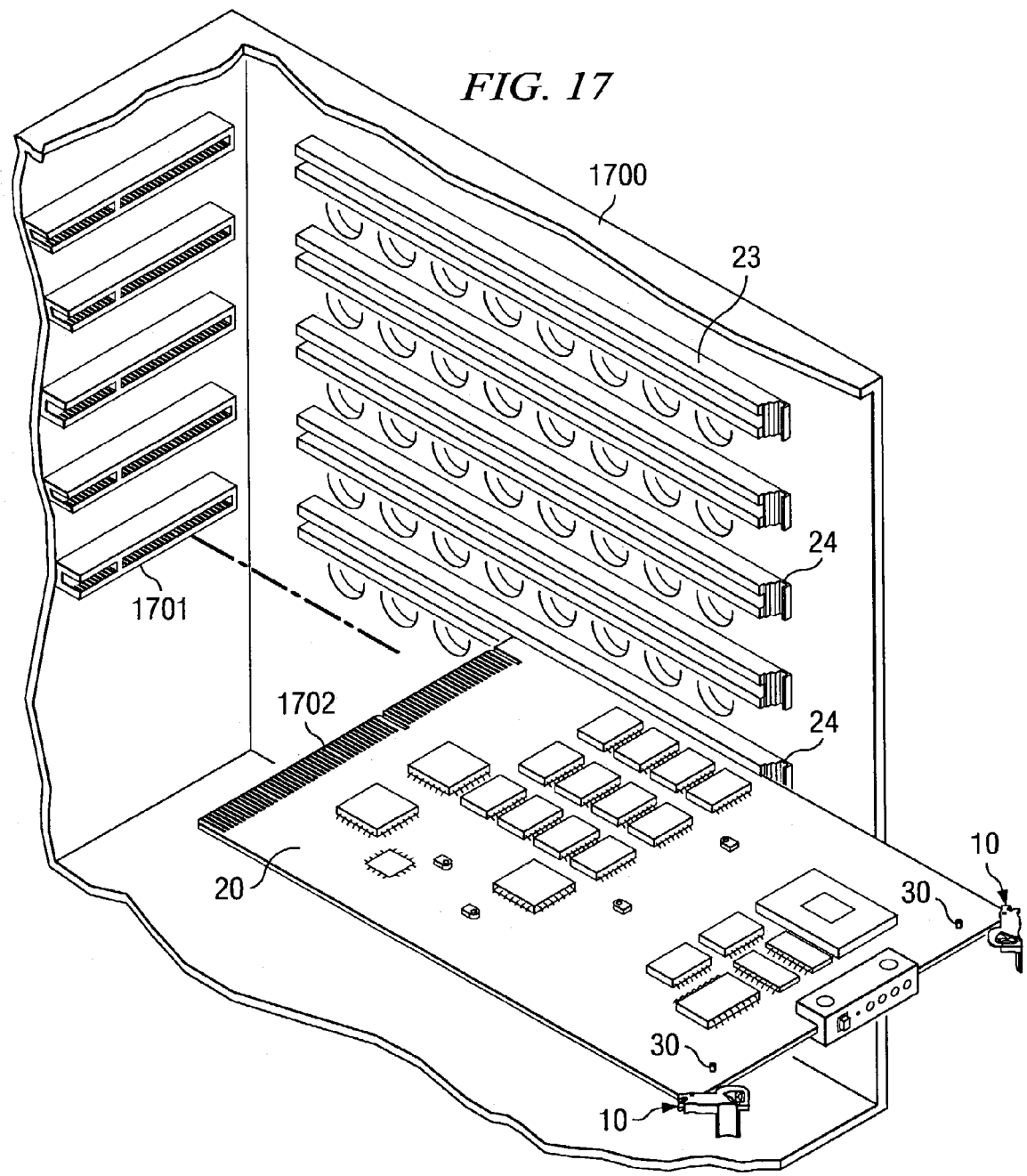
FIG. 17 shows a partial cut-away view of a housing having connectors at the back thereof for receiving circuit boards.

As shown in FIG. 3, the user presses on the outside surface of tab 14 of device 10 thereby forcing PWB 20 backward (in the direction of arrow 225) within a housing so that the contacts at the back edge of PWB 20 (shown in FIG. 17) become mated with a corresponding connector (shown in FIG. 17). As connector 10 rotates around pivot pin 220, PWB 20 is forced backward and upper and lower portions 17 and 18 slide over edge 21 of PWB 20 to the point where spring 106 (FIG. 1) contacts area 22 of edge 21. Note that in the position shown in FIG. 3, the leading edge of slide 19 of latch 1600 has not yet engaged pin 30.

Figure 4:
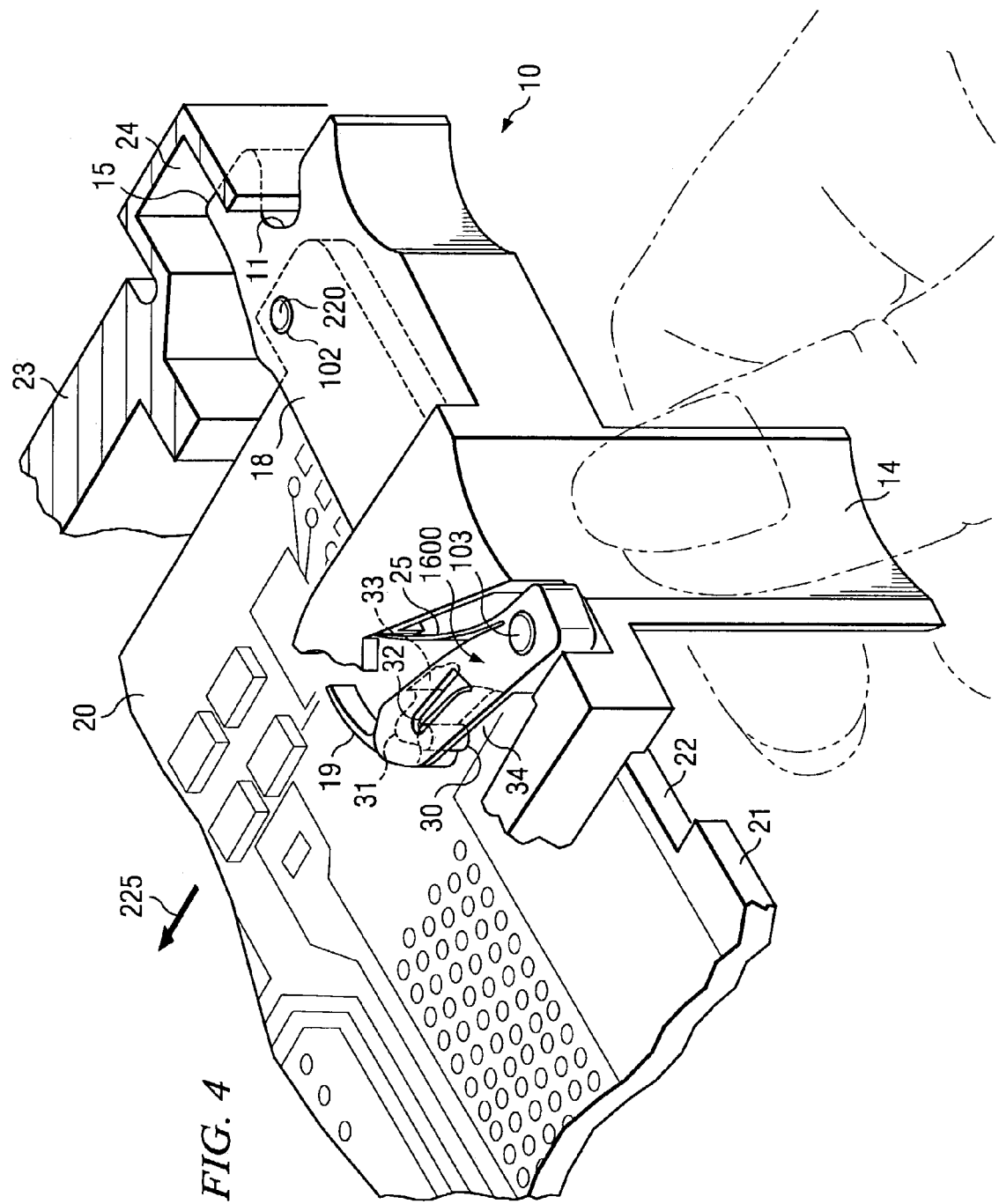
FIG. 4 shows the insertion/retraction device of FIG. 1 just prior to being latched to the circuit board.

As shown in FIG. 4, the leading edge of slide 19 engages (and passes beyond) pin 30 such that pin 30 enters opening 34 in latch 1600. Spring 25 provides a bias force to latch 1600 (to the left in FIG. 4) such that latch 1600 rotates around pin 103 while device 10 rotates around pin 102, forcing pin 30 to enter opening 34 and come to rest against stop 32. At this point in the operation of device 10, the user is preferably still applying insertion force on device 10 via tab 14. This operation preferably ensures that the board contact edge over travels into the housing connector further than is actually necessary for electrical contact while this pressure is being applied to tab 14.

Figure 5:
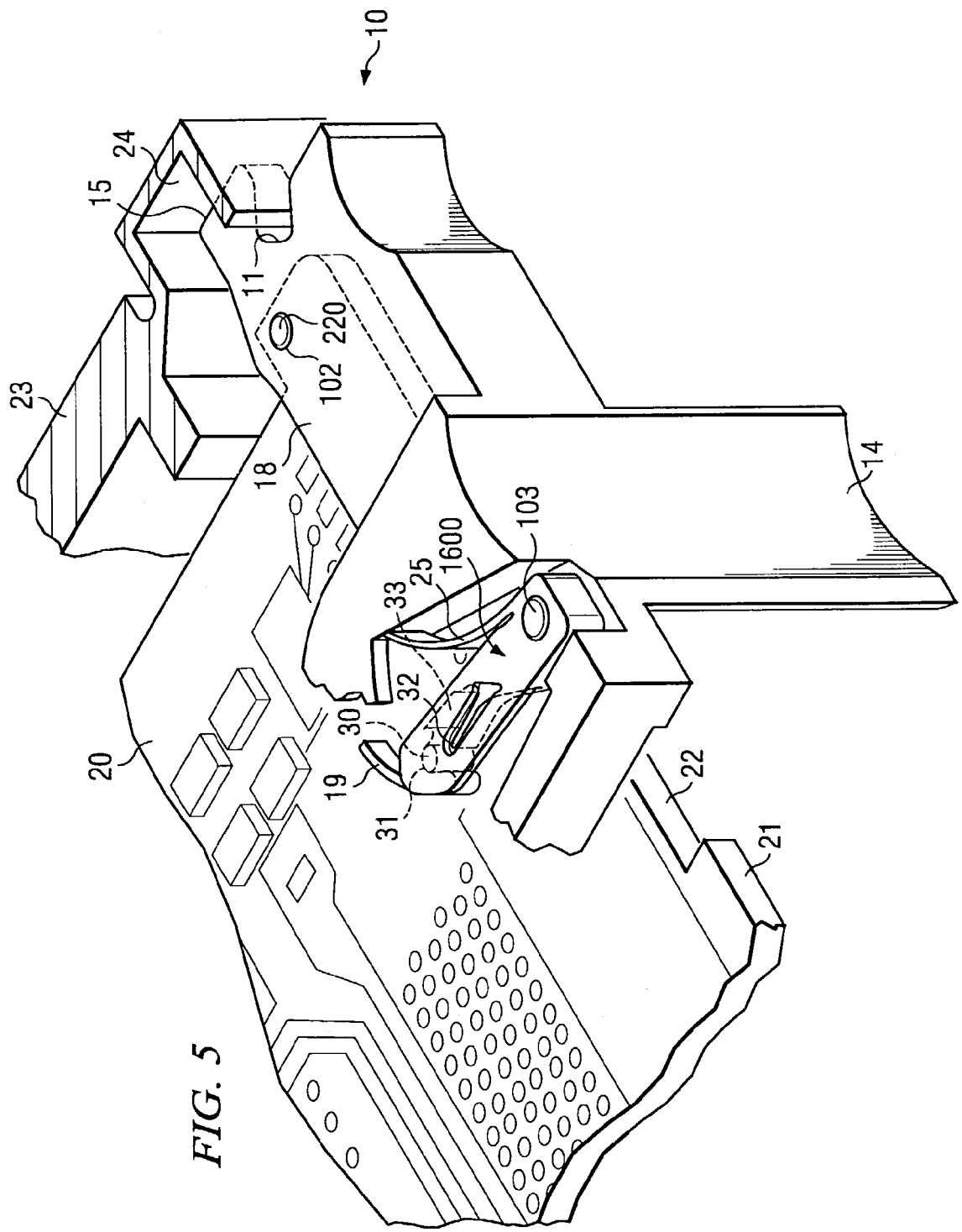
FIG. 5 shows the insertion/retraction n device of FIG. 1 latched to the board, holding the circuit board in place within a connector at the back of the housing.

In FIG. 5 the user has removed the external force from tab 14 allowing device 10 retreat toward the user under control of force applied by spring 106 (shown best in FIG. 1). This outward force on device 10 allows pin 30 to move past the end of stop 32 and into notch 31. This outward force also allows PWB 20 to move slightly back out of its mating connector, thereby accommodating the over travel discussed above. If desired, this motion could result in positive feed-back, such as a click or tactile sense, so that the user hears and/or feels the positive latching of device 10 onto pin 30 of PWB 20. At this point, the over-center movement created between pin 30 and notch 11 in mating relationship with edge 24 of guide 23 serve to latch PWB 20 into the connector at the back of the housing. The over-center nature of this force locks device 10 in place, thereby providing positive force serving to maintain PWB 20 positioned inside the connector for positive electrical contact.

Figure 6:
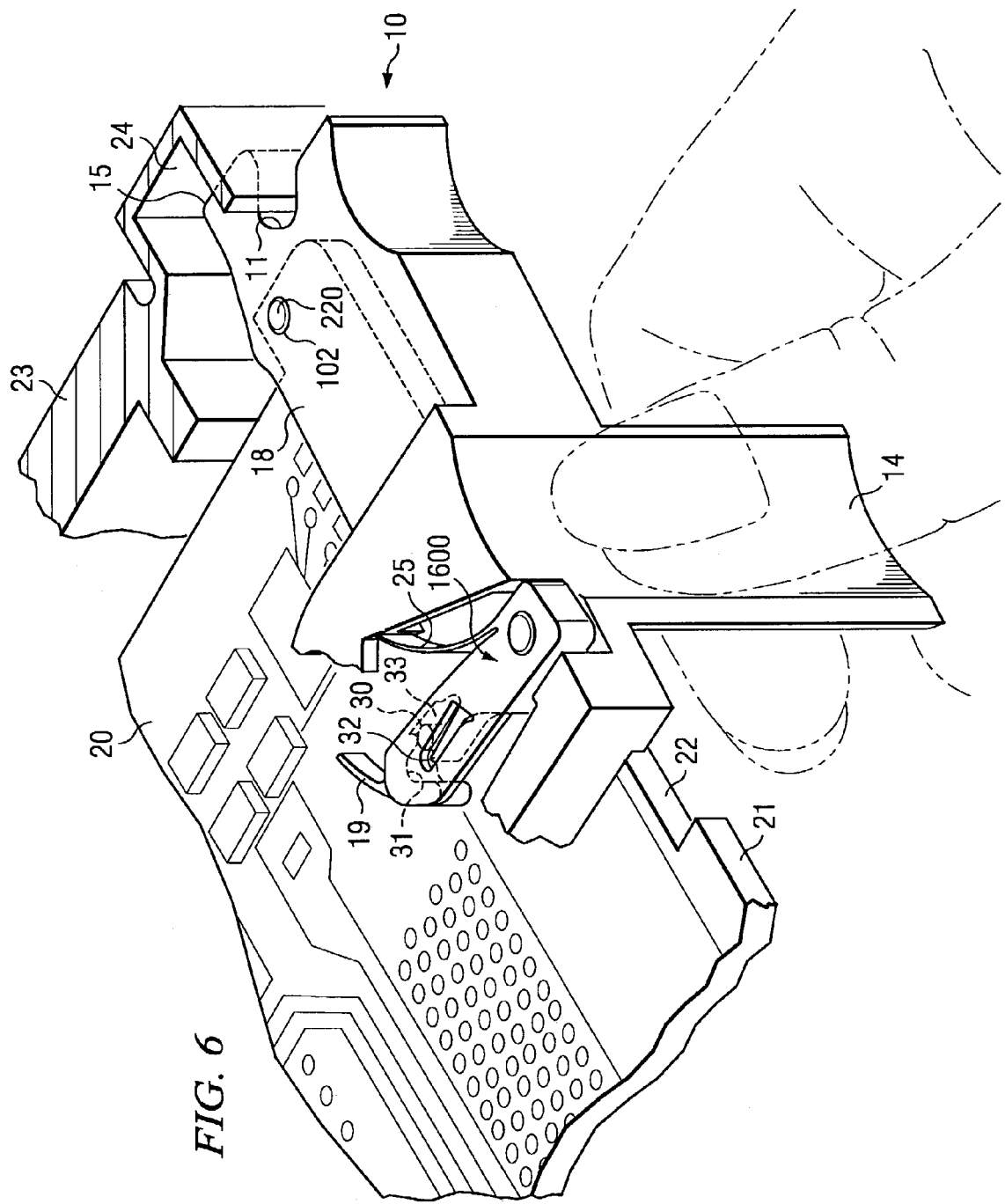
FIG. 6 shows the insertion/retraction device of FIG. 1 being disengaged from the circuit board in preparation for removing the circuit board from the connector at the back of the housing.

As shown in FIG. 6, when it is desired to release PWB 20 from the connector, the user may apply inward force to device 10 via tab 14. This inward force combined with the bias force from spring 25 serves to allow pin 30 to exit latch 1600 via opening 33. Once pin 30 exits opening 33, device 10 is free to rotate outward around pivot pin 220 and away from PWB 20, thereby allowing PWB 20 to be removed from the housing.

FIGS. 7 through 15 show schematic views of various stages of the locking mechanism just described with respect to pin 30.

Figure 7:
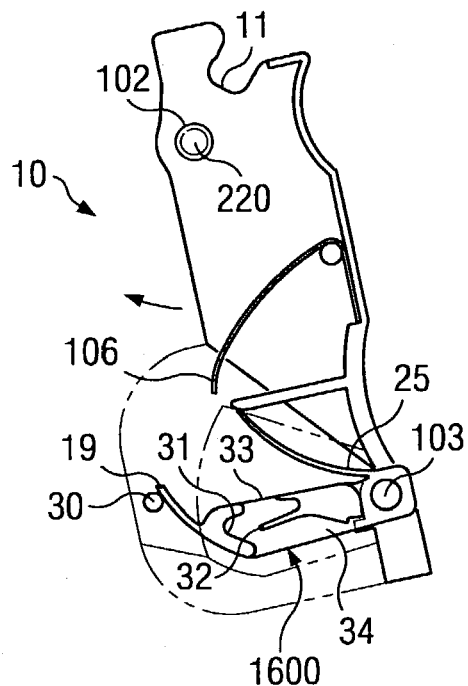
FIGS. 7 through 15 shows various stages of locking the insertion/retraction device to the board.

In FIG. 7 device 10 is being rotated toward a latched position (the lower portion is moving to the left in the figure) such that a leading edge of slide 19 of latch 1600 is just contacting pin 30 on PWB 20. The leading edge of slide 19 slides along pin 30 as device 10 continues to rotate to the left.

Figure 8:
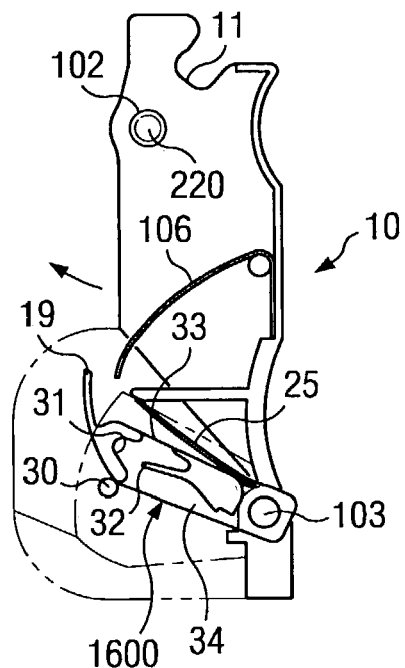

FIG. 8 shows pin 30 sliding down the lower surface of the leading edge of slide 19 while spring 25 applies a bias force holding against pin 30 slide 19. As device 10 rotates more toward the latched position, pin 30 moves toward opening 34 in latch 1600.

Figure 9:
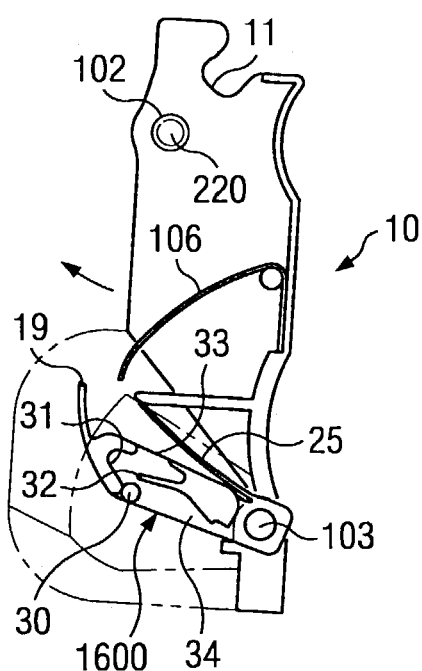

FIG. 9 shows pin 30 entering latch 1600 via opening 34 and moving toward stop 32.

Figure 10:
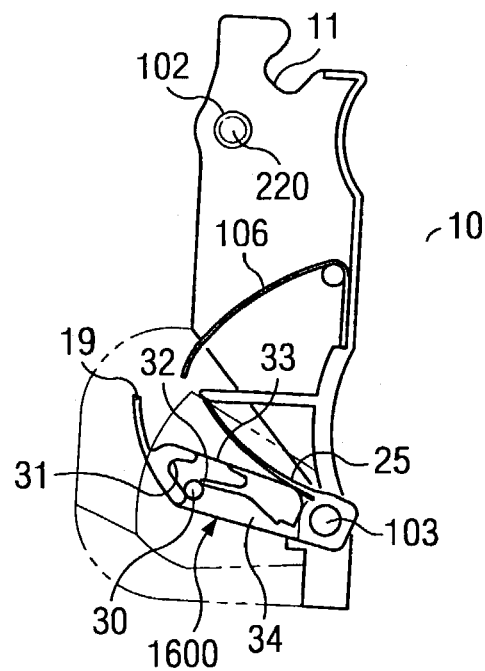

FIG. 10 shows pin 30 in contact with stop 32. According to a preferred embodiment, pin 30 can move no further relative to latch 1600 until insertion force (left rotation of device 10) is removed from device 10.

Figure 11:
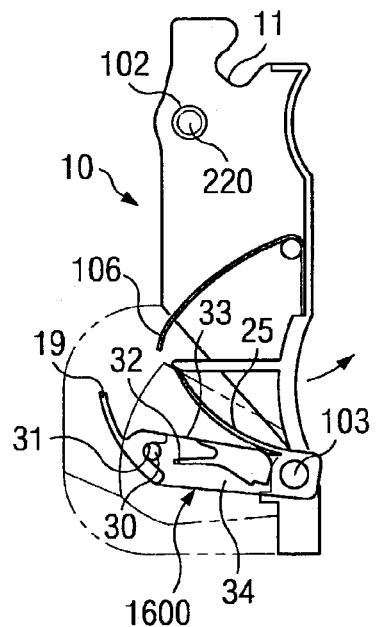

FIG. 11 shows device 10 moving slightly outward under force supplied by spring 106, thereby allowing pin 30 to enter notch 31. At this point, device 10 has pivoted around pivot pin 220 in an over-center fashion (between pin 30 and edge 24 (FIG. 2)) such that the board on which device 10 is mounted cannot be removed from the housing until device 10 is released from pin 30.

Figure 12:
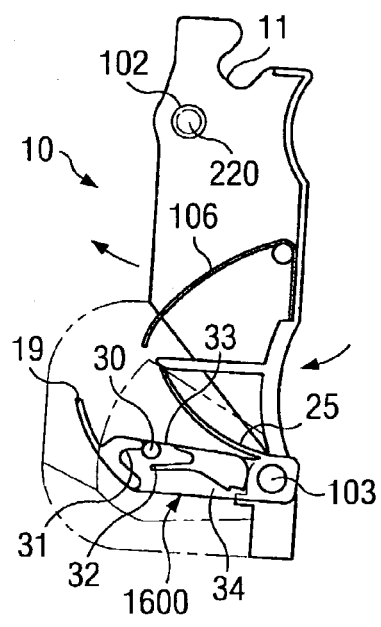

FIG. 12 shows where slight inward (insertion direction) force has been applied to device 10, such as via tab 14 (FIG. 3) thereby moving latch 1600 slightly (to the left in FIG. 12), thereby releasing pin 30 from notch 31. Bias force provided by spring 25 causes latch 1600 to rotate about pin 103 (down in FIG. 12) allowing pin 30 to exit latch 1600 through opening 33.

Figure 13:
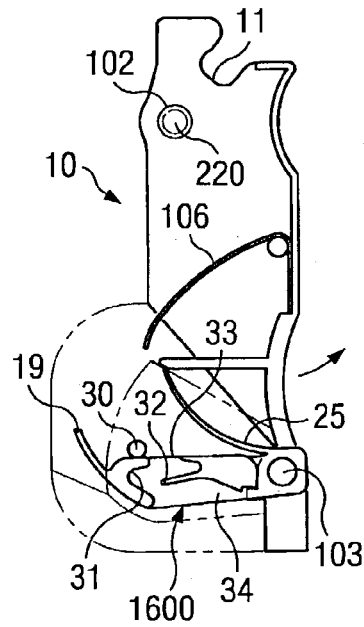
Figure 14:
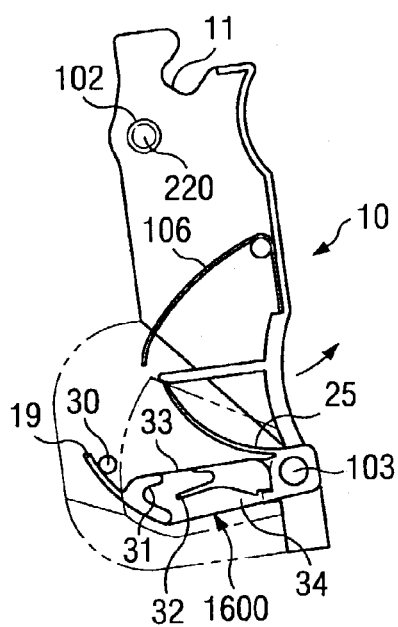
Figure 15:
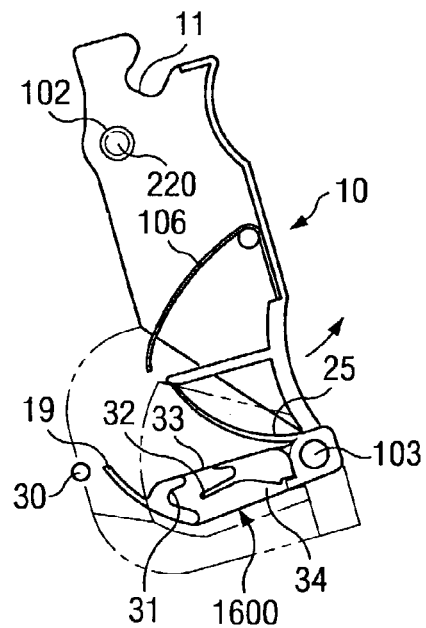

FIG. 13 shows pin 30 having exited latch 1600 through opening 33. As shown in FIG. 13, device 10 is now free to rotate toward a release position (to the right in FIG. 13). As shown in FIG. 14, pin 30 moves along the trailing side of edge of slide 19 as device 10 is continued to be rotated toward a release position. FIG. 15 shows device 10 in a release position, i.e., pin 30 is disengaged from latch 1600, and the board to which device 10 is attached can now be removed from the housing (FIG. 2).

Figure 16A:
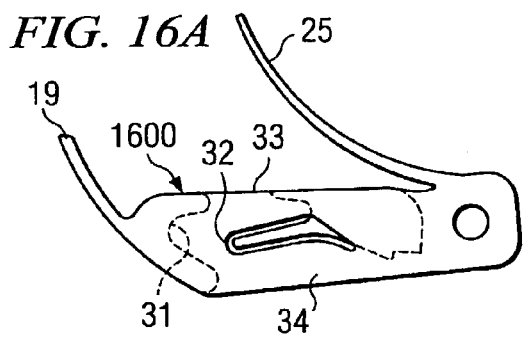
FIGS. 16A and 16B show top and bottom views, respectively, of one embodiment of the latching mechanism of the insertion/retraction device shown in FIG. 1.
Figure 16B:
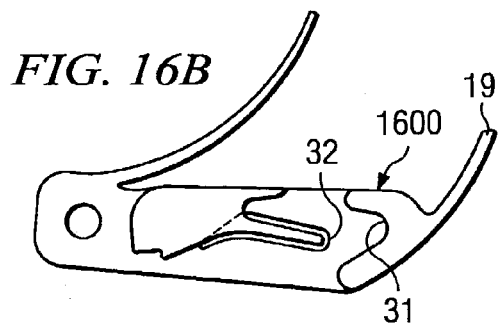

To aid in the understanding of the foregoing, an embodiment of latch 1600 as described in FIGS. 7-15 is shown separate from the remainder of device 10 in FIGS. 16A and 16B. Specifically, FIG. 16A shows the top view of latch 1600 and FIG. 16B shows the bottom view.

FIG. 17 shows a cut-away view of housing 1700 having guide 23 having connectors, 1701 mounted along the back side of the housing with PWB 20 positioned therein. PWB 20 has contacts 1702 for electrically mating with contacts within a mated connector 1701. PWB 20 is shown with two devices 10, but could only have one mounted on either side, if desired. Device 10 can be permanently mounted to PWB 20, or can be slipped over pin 220 (FIG. 2) when desired.

Although embodiments have been described herein with reference to directional and/or relative terms, such as top, bottom, left, right, it should be appreciated that the concepts of the present invention are not limited to application in any particular orientation. References to such directional and relative terms has been provided for aiding the reader in understanding the concepts of the present invention.

What is claimed is:

1. A device for insertion and removal of a circuit board into a mating connector, said connector positioned within a housing, said device comprising:
   a first end for pivotal engagement with said circuit board, said first end also adapted to mate with a front surface of said housing when said circuit board to which said device is pivotally engaged begins to engage said connector;
   a second end disposed longitudinally from said first end, said second end adapted with a latch having a slot for releasably mating with a protrusion on said circuit board such that when said board is engaged with said connector said second end becomes releasably mated to said protrusion thereby latching said board to said connector wherein said first end and said second end are part of one continuous member of said device; and
   wherein said slot engages said board protrusion, said slot having a notch for mating with said board protrusion, said notch allowing for over travel of said circuit board during mating of said board into said mating connector while serving to lock said board in said mated relationship with said connector.

2. The device of claim 1 wherein an outer surface of said latch accepts a reapplication of insertion force to release said mating relationship.

3. The device of claim 1 further comprising a finger tab for allowing a user to exert said force on said device.

4. The device of claim 1 wherein said first end pivotal engagement is permanent.

5. A method of locking a printed wiring board into a connector, said connector mounted to a housing, said housing having at least one guide for positioning said board with respect to said connector, said method comprising:
   placing a board within said guide in a direction such that said board will, upon the application of insertion force thereupon, move into mated relationship with said connector;
   applying said insertion force to said board to move said board toward said connector until a first end of a device which is pivotally mounted to said board engages with an edge of said housing;
   rotating said device so that a longitudinal portion of said device engages on a portion of said board;
   continuing to apply force to said device so as to move said board and said connector into said mated relationship;
   retaining said device in an engaged position on said portion of said board, even after said external insertion force has been removed, said engaged position maintaining a force to bias said board into said connector and preventing said board from becoming disconnected from said connector at least in part by said first end of said device engaging said edge of said housing; and
   briefly reapplying a force in the direction of said insertion force to an outer edge of said device to release said maintained engaged position.

6. The method of claim 5 comprising:
   pivotally rotating said device outward, thereby allowing said board to become disconnected from said connector.

7. The method of claim 5 wherein said retaining step includes providing positive feed-back to a user that said engaged position is being maintained.

8. A device for locking a printed wiring board (PWB) into a connector, said connector mounted to a housing, said housing having at least one guide for positioning said board with respect to said connector, said device comprising:

means for applying an external insertion force to said PWB to move said PWB toward said connector along said guide, said means having a first end pivotally attached to said PWB board, said first end having a portion for engaging with a portion of said housing;

means for contacting a front edge of said PWB along a longitudinal portion of said device;

means for maintaining at least a portion of said insertion force so that said means for contacting said front edge maintains a force to bias said PWB into said connector after said external insertion force has been removed; and means operative upon the reapplying of said external insertion force for releasing said maintained positive force.

9. The device of claim 8 wherein said maintaining means includes an over-center latch.

10. The device of claim 8 wherein said maintaining means includes a pin mounted permanently to said board.

11. A latching device for use with housing accepting a plurality of electronic boards into mating relationship with a plurality of connectors affixed to said housing, said housing having at least one locking portion for mating with said latching device pivotally mounted on at least one electronic board, said latching device comprising:

means for applying an external insertion force to an electronic board of said plurality of electronic boards to move said electronic board toward a corresponding connector of said plurality of connectors along a guide, said means having a first end pivotally attached to said board, said first end having a portion for engaging with a portion of said housing;

means for contacting a front edge of said electronic board along a longitudinal portion of said device;

means for maintaining at least a portion of said insertion force so that said means for contacting said front edge maintains a force to bias said electronic board into said connector after said external insertion force has been removed; and means operative upon the reapplying of said external insertion force for releasing said maintained positive force.

12. A device for aiding in latching an electronic circuit board in a mated relationship with an electrical connector, said connector located at a back end of a housing, said device comprising:

a first end for engaging a front surface of said housing;

means for pivoting said first end around an outer corner of a circuit board to be latched;

a second end disposed laterally from said first end said second end comprising a latch mechanism for releasably latching to a pin mounted on said board wherein operation of said latch mechanism provides over travel of said electronic circuit board during mating of said electronic circuit board into said electrical connector; and a body extending between said ends, said body having upper and lower portions separated by a distance to allow at least a portion of said board to fit between said portions when said latch mechanism is latched to said pin.

13. The device of claim 12 further comprising:

a spring located between said upper and lower portions and operable for providing outward force on said device when said device is latched to said pin.

14. The device of claim 13 wherein said latching mechanism further comprising:

a slide for contacting said pin and for directing said pin to a notch within said mechanism.

15. The device of claim 14 wherein said latching mechanism further comprises a stop for preventing said pin from reaching said notch which insertion pressure is executed on said device.

16. The device of claim 15 wherein said spring encourages said latching mechanism to move so that said pin may enter said notch when said insertion pressure is removed from said device.

17. The device of claim 16 wherein said latching mechanism includes a second spring for encouraging said latch to rotate such that said latch becomes disengaged from said pin.

* * * * *